(12) United States Patent
Wei et al.

(10) Patent No.: US 12,538,685 B2
(45) Date of Patent: Jan. 27, 2026

(54) PIXEL ARRANGEMENT STRUCTURE, DISPLAY PANEL, DISPLAY APPARATUS AND MASK GROUP

(71) Applicants: Chengdu BOE Optoelectronics Technology Co., Ltd., Sichuan (CN); BOE TECHNOLOGY GROUP CO., LTD., Beijing (CN)

(72) Inventors: Qinhe Wei, Beijing (CN); Zhaowei Yu, Beijing (CN); Shuang Lin, Beijing (CN); Guangjun Song, Beijing (CN); Yuping He, Beijing (CN); Hongbin Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 492 days.

(21) Appl. No.: 18/029,306

(22) PCT Filed: Apr. 24, 2022

(86) PCT No.: PCT/CN2022/088686
§ 371 (c)(1),
(2) Date: Mar. 29, 2023

(87) PCT Pub. No.: WO2023/205921
PCT Pub. Date: Nov. 2, 2023

(65) Prior Publication Data
US 2024/0365625 A1    Oct. 31, 2024

(51) Int. Cl.
*H10K 59/35*   (2023.01)
*C23C 14/04*   (2006.01)
(Continued)

(52) U.S. Cl.
CPC ......... *H10K 59/353* (2023.02); *C23C 14/042* (2013.01); *H10K 50/80* (2023.02);
(Continued)

(58) Field of Classification Search
CPC .. H10K 59/353; H10K 71/166; H10K 59/352; C23C 14/042
See application file for complete search history.

(56) References Cited

U.S. PATENT DOCUMENTS

| 7,184,066 B2 * | 2/2007 | Elliot ....................... G09G 3/20 345/694 |
| 2019/0035861 A1 * | 1/2019 | Wang ................... H10K 59/351 |

(Continued)

FOREIGN PATENT DOCUMENTS

| CN | 105096754 A | 11/2015 |
| CN | 111863889 A | 10/2020 |
| CN | 113745299 A | 12/2021 |

*Primary Examiner* — Bradley Smith
*Assistant Examiner* — Kimberly Newman Frey
(74) *Attorney, Agent, or Firm* — HOUTTEMAN LAW LLC

(57) ABSTRACT

A pixel arrangement structure, a display panel, a display apparatus and a mask group are provided. The pixel arrangement structure includes basic pixel units in first and/or second directions. Each basic pixel unit includes five sub-pixels, first to third sub-pixels are of different colors, and third to fifth sub-pixels are of a same color; the first sub-pixel includes opposite first and second sides in the first direction, and opposite third and fourth sides in the second direction; and the second sub-pixel is on and separated from the third side of the first sub-pixel, the third sub-pixel is on and separated from the first side of the first sub-pixel, fourth and fifth sub-pixels are both on the fourth side of the first sub-pixel and are separated from the fourth side of the first sub-pixel, and are separated from each other in the first direction.

20 Claims, 7 Drawing Sheets

(51) Int. Cl.
*F21V 8/00* (2006.01)
*H10K 50/80* (2023.01)
*H10K 59/121* (2023.01)
*H10K 71/16* (2023.01)

(52) U.S. Cl.
CPC ........... *H10K 59/121* (2023.02); *H10K 59/35* (2023.02); *H10K 59/352* (2023.02); *H10K 71/166* (2023.02); *G02B 6/0086* (2013.01)

(56) References Cited

U.S. PATENT DOCUMENTS

2021/0134892 A1* 5/2021 Hwang ................ G09G 3/2003
2022/0069031 A1* 3/2022 Yue ...................... H10K 59/352

* cited by examiner

PIXEL ARRANGEMENT STRUCTURE, DISPLAY PANEL, DISPLAY APPARATUS AND MASK GROUP

TECHNICAL FIELD

The present disclosure relates to the field of display technology, and in particular to a pixel arrangement structure, a display panel, a display apparatus and a mask group.

BACKGROUND

An OLED (organic light emitting diode) display has the characteristics of wide color gamut, fast response speed, wide viewing angle, active luminescence, flexibility and the like, and has become a mainstream product in the display field and gradually extends to the fields of mobile phones, vehicle-mounted devices, wearable devices, VR (virtual reality) devices and the like. Users have higher requirements on the display effect of a display apparatus.

SUMMARY

The present disclosure provides a pixel arrangement structure, a display panel, a display apparatus and a mask group.

A first aspect of the present disclosure provides a pixel arrangement structure, including: a plurality of basic pixel units in a first direction and/or a second direction, wherein each basic pixel unit includes a first sub-pixel, a second sub-pixel, a third sub-pixel, a fourth sub-pixel and a fifth sub-pixel, the first sub-pixel, the second sub-pixel and the third sub-pixel are sub-pixels of different colors, and the third sub-pixel, the fourth sub-pixel and the fifth sub-pixel are sub-pixels of the same color; wherein the first sub-pixel includes a first side and a second side opposite to each other in the first direction, and a third side and a fourth side opposite to each other in the second direction; and the second sub-pixel is on the third side of the first sub-pixel and is separated from the third side of the first sub-pixel, the third sub-pixel is on the first side of the first sub-pixel and is separated from the first side of the first sub-pixel, the fourth sub-pixel and the fifth sub-pixel are both on the fourth side of the first sub-pixel and are separated from the fourth side of the first sub-pixel, and the fourth sub-pixel inclines to be close to the first side and the fifth sub-pixel inclines to be close to the second side.

In some embodiments, a long axis of each of the fourth sub-pixel and the fifth sub-pixel is disposed obliquely with respect to the second direction, and an angle therebetween is an acute angle.

In some embodiments, the fourth sub-pixel and the fifth sub-pixel are mirror-symmetrical with respect to a long axis of the first sub-pixel as a symmetry axis.

In some embodiments, a long axis of the first sub-pixel is parallel to the second direction and a long axis of the second sub-pixel is parallel to the first direction.

In some embodiments, the first sub-pixel, the second sub-pixel and the third sub-pixel have a same shape and have different areas; or the first sub-pixel, the second sub-pixel and the third sub-pixel have different shapes and have different areas.

In some embodiments, an area of the first sub-pixel is larger than an area of the second sub-pixel, and the area of the second sub-pixel is larger than an area of the third sub-pixel.

In some embodiments, the third sub-pixel, the fourth sub-pixel and the fifth sub-pixel have a same shape and have a same area.

In some embodiments, the first direction is perpendicular to the second direction.

In some embodiments, the first sub-pixel is a blue sub-pixel, the second sub-pixel is a red sub-pixel, and the third sub-pixel, the fourth sub-pixel and the fifth sub-pixel are green sub-pixels; or the first sub-pixel is a red sub-pixel, the second sub-pixel is a blue sub-pixel, and the third sub-pixel, the fourth sub-pixel and the fifth sub-pixel are green sub-pixels.

In some embodiments, light emitting layers of the fifth sub-pixel in one basic pixel unit, the third sub-pixel and the fourth sub-pixel in another basic pixel unit adjacent to a second side of the one basic pixel unit have a one-piece structure.

A second aspect of the present disclosure provides a display panel, including: the pixel arrangement structure of any one of the embodiments of the present disclosure.

In some embodiments, the display panel includes an active matrix organic light emitting diode display panel.

A third aspect of the present disclosure provides a display apparatus, including the display panel of any one of the embodiments of the present disclosure.

A fourth aspect of the present disclosure provides a mask group for manufacturing the pixel arrangement structure of any one of the embodiments of the present disclosure, including: a first mask, a second mask and a third mask, wherein the first mask is provided with a plurality of first openings therein at intervals in the first direction and/or the second direction, and the plurality of first openings are used for forming first sub-pixels; the second mask is provided with a plurality of second openings therein at intervals in the first direction and/or the second direction, and the plurality of second openings are used for forming second sub-pixels; the third mask is provided with a plurality of third openings therein at intervals in the first direction and/or the second direction, and the plurality of third openings are used for forming third sub-pixels, fourth sub-pixels, and fifth sub-pixels.

In some embodiments, the fifth sub-pixel of one basic pixel unit, and the third sub-pixel and the fourth sub-pixel of another basic pixel unit adjacent to the second side of the one basic pixel unit are formed by the same third opening when multiple basic pixel units arranged in the first direction are formed.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. The above and other features and advantages will become more apparent to a person with ordinary skill in the art by describing in detail exemplary embodiments thereof with reference to the drawings.

Figure 1:
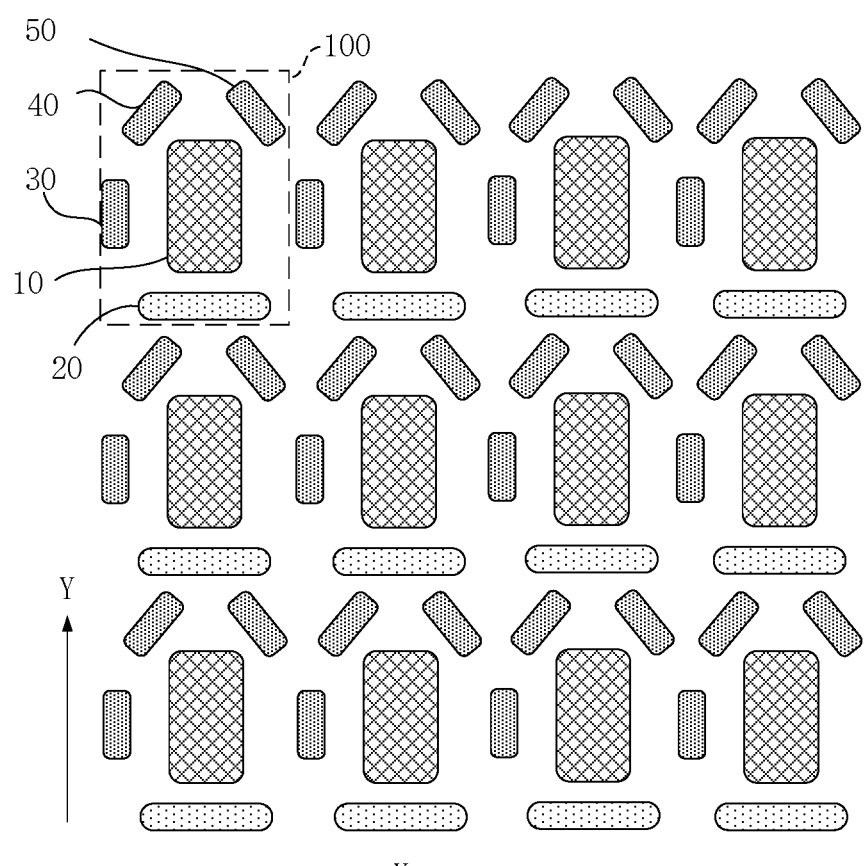
FIG. 1 is a schematic diagram of a pixel arrangement structure according to an embodiment of the present disclosure.

The reference numbers are:

100—Basic pixel unit, 100A—First basic pixel unit, 100B—Second basic pixel unit, 10—First sub-pixel, 201—First display pixel unit, 202—Second display pixel unit, 203—Third display pixel unit, 20—Second sub-pixel, 30—Third sub-pixel, 40—Fourth sub-pixel, 50—Fifth sub-pixel, 11—First mask, 12—First opening, 21—Second mask, 22—Second opening, 31—Third mask, and 32—Third opening.

DETAIL DESCRIPTION OF EMBODIMENTS

In order to enable one of ordinary skill in the art to better understand the technical solutions of the present disclosure, the present disclosure will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

In the related art, a display effect of a display apparatus can be improved by reducing a pixel size and a pixel gap, but which is a difficult breakthrough way due to the limitation of the manufacturing process. For this reason, changing a pixel arrangement structure and adopting a sub-pixel rendering technique becomes an important means for improving the resolution.

An OLED display panel comprises a plurality of pixel repeating units, each of which includes three sub-pixels of an R sub-pixel (red sub-pixel), a G sub-pixel (green sub-pixel), and a B sub-pixel (blue sub-pixel). The more the pixel repeating units are arranged in a limited space (i.e. the higher the PPI (pixel per inch) is), the better the display effect of the OLED display panel can achieve.

The embodiment of the present disclosure provides a pixel arrangement structure, which can improve a pixel density and achieve a higher PPI, so that the OLED display panel can display an image with more details, and there is no saw tooth at the edge of the image; meanwhile, an aperture ratio of a pixel unit is increased, a current density of a pixel is reduced, and a service life of the OLED display panel is prolonged.

It should be noted that, shapes and sizes of the components in the drawings are not to be reflected in a true scale, and are only for schematically illustrating the present disclosure. The shape of the component refers to a shape of an orthographic projection of the component on the substrate.

Figure 2:
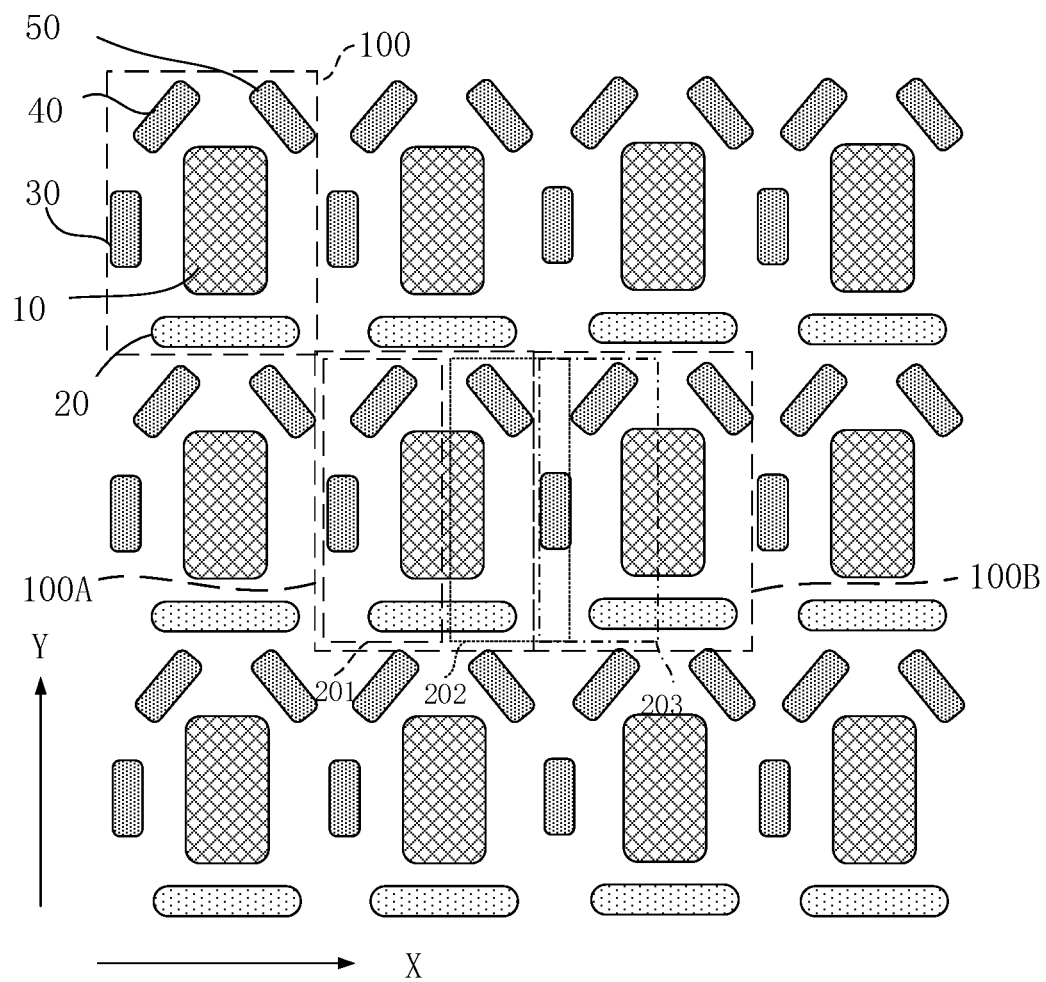
FIG. 2 is a schematic diagram of a pixel arrangement structure according to an embodiment of the present disclosure.

The embodiment of the present disclosure provides a pixel arrangement structure. Referring to FIGS. 1 and 2, the pixel arrangement structure includes a plurality of basic pixel units 100 disposed in a first direction and/or a second direction, and each of the basic pixel units 100 includes a first sub-pixel 10, a second sub-pixel 20, a third sub-pixel 30, a fourth sub-pixel 40, and a fifth sub-pixel 50.

In the embodiment of the present disclosure, each of the basic pixel units 100 is a repeating unit, that is, the basic pixel units 100 are repeatedly disposed in the first direction and/or the second direction. It should be noted that the number of the basic pixel units 100 in the first direction and the second direction is not limited in the embodiment of the present disclosure. For example, in the first direction, the number of the basic pixel units 100 may be 1, 2, or more; in the second direction, the number of the basic pixel units 100 may be 1, 2, or more. The numbers of the basic pixel units 100 in the first direction and the second direction may or may not be equal to each other.

For convenience of explanation and understanding of the present disclosure, the pixel arrangement structure of the present disclosure is explained below by taking an array formed by disposing four basic pixel units 100 in the first direction and disposing three basic pixel units 100 in the second direction as an example.

In the embodiment of the present disclosure, in each basic pixel unit 100, the first sub-pixel 10, the second sub-pixel 20, and the third sub-pixel 30 are sub-pixels having different colors from each other, and the third sub-pixel 30, the fourth sub-pixel 40, and the fifth sub-pixel 50 are sub-pixels having the same color. In other words, the third sub-pixel 30, the fourth sub-pixel 40, and the fifth sub-pixel 50 have the same color, which is different from the colors of the first sub-pixel 10 and the second sub-pixel 20.

In some embodiments, the first sub-pixel 10 is a first color sub-pixel, the second sub-pixel 20 is a second color sub-pixel, the third sub-pixel 30 is a third color sub-pixel, and a number ratio of the first color sub-pixels, the second color sub-pixels, and the third color sub-pixels is 1:1:3.

In the embodiment of the present disclosure, the first sub-pixel 10 includes a first side and a second side opposite to each other in the first direction, and a third side and a fourth side opposite to each other in the second direction. The basic pixel unit 100 includes a first side and a second side opposite to each other in the first direction, and a third side and a fourth side opposite to each other in the second direction. When directly facing FIGS. 1 and 2, the first side of the first sub-pixel 10 is a lower side of the first sub-pixel 10, the second side of the first sub-pixel 10 is an upper side of the first sub-pixel 10, the third side of the first sub-pixel 10 is a left side of the first sub-pixel 10, and the fourth side of the first sub-pixel 10 is a right side of the first sub-pixel 10. The first, second, third, and fourth sides of the basic pixel unit 100 are the same as the first, second, third, and fourth sides of the first sub-pixel 10, and thus are not described herein again.

In the embodiment of the present disclosure, the second sub-pixel 20 is disposed on the third side of the first sub-pixel 10 and is separated from the third side of the first sub-pixel 10, the third sub-pixel 30 is disposed on the first side of the first sub-pixel 10 and is separated from the first side of the first sub-pixel 10, the fourth sub-pixel 40 and the fifth sub-pixel 50 are both disposed on the fourth side of the first sub-pixel 10 and are separated from the fourth side of the first sub-pixel 10, and the fourth sub-pixel 40 and the fifth sub-pixel 50 are separated from each other in the first direction.

As shown in FIGS. 1 and 2, the first sub-pixel 10 is located in a middle region of the basic pixel unit 100, and the second sub-pixel 20, the third sub-pixel 30, the fourth sub-pixel 40, and the fifth sub-pixel 50 are disposed around the first sub-pixel 10, that is, the second sub-pixel 20 and the third sub-pixel 30 are disposed on the third side and the first side of the first sub-pixel 10, respectively, and the fourth sub-pixel 40 and the fifth sub-pixel 50 are disposed on the fourth side of the first sub-pixel 10. Moreover, the fourth sub-pixel 40 and the fifth sub-pixel 50 are separated from each other in the first direction, that is, the fourth sub-pixel 40 is close to the first side, and the fifth sub-pixel 50 is close to the second side, so that effective light emitting regions of the fourth sub-pixel 40 and the fifth sub-pixel 50 do not interfere with each other.

The middle region is defined with reference to the region where the basic pixel unit 100 is located, and is a region around a symmetry center of the basic pixel unit 100. In some embodiments, a symmetry center of the first sub-pixel 10 may coincide with the symmetry center of the basic pixel unit 100, or a distance between the symmetry center of the basic pixel unit 100 and the symmetry center of the first sub-pixel 10 may be within a preset distance range.

As shown in FIGS. 1 and 2, there is a gap between the first sub-pixel 10 and each of the second sub-pixel 20, the third sub-pixel 30, the fourth sub-pixel 40, and the fifth sub-pixel 50 around the first sub-pixel 10; and there is a gap between any two of the second sub-pixel 20, the third sub-pixel 30, the fourth sub-pixel 40, and the fifth sub-pixel 50. In this way, light emissions of the first sub-pixel 10, second sub-pixel 20, third sub-pixel 30, fourth sub-pixel 40, and fifth sub-pixel 50 do not interfere with each other. Further, since there is a gap between the basic pixel units 100, light emission of the basic pixel units 100 does not interfere with each other.

In the pixel arrangement structure provided by the embodiment of the present disclosure, the first sub-pixel 10 is disposed in the middle region of the basic pixel unit 100, and the second sub-pixel 20, the third sub-pixel 30, the fourth sub-pixel 40, and the fifth sub-pixel 50 are disposed around the first sub-pixel 10, so that a space occupied by the basic pixel unit 100 can be reduced. That is, more basic pixel units 100 can be arranged in a limited space, and at the same time the crosstalk between the sub-pixels can be avoided.

In some embodiments, a long axis of each of the fourth sub-pixel 40 and the fifth sub-pixel 50 is disposed obliquely with respect to the second direction, and the angle therebetween is an acute angle.

In the embodiment of the present disclosure, the first sub-pixel 10, the second sub-pixel 20, the third sub-pixel 30, the fourth sub-pixel 40, and the fifth sub-pixel 50 have different lengths and different widths, and a long axis is defined in a length direction, that is, the long axis is a symmetry axis of the sub-pixel in the length direction; a short axis is defined in a width direction, i.e., the short axis is a symmetry axis of the sub-pixel in the width direction.

In some embodiments, the long axis of each of the fourth sub-pixel 40 and the fifth sub-pixel 50 is inclined at any angle in a range from 0° to 90° with respect to the second direction. Further, as the angle of each of the long axes of the fourth sub-pixel 40 or the fifth sub-pixel 50 with respect to the second direction is closer to 45°, it is more advantageous to reduce a size of the basic pixel unit 100. For example, the angle of each of the long axes of the fourth sub-pixel 40 and the fifth sub-pixel 50 with respect to the second direction is in a range from 30° to 60°. For example, the angle of each of the long axes of the fourth sub-pixel 40 and the fifth sub-pixel 50 with respect to the second direction is in a range from 40° to 50°.

As shown in FIGS. 1 and 2, the long axis of the first sub-pixel 10 is arranged parallel to the second direction, the long axis of the second sub-pixel 20 is arranged parallel to the first direction, the long axis of the third sub-pixel 30 is arranged parallel to the second direction, the long axes of the fourth sub-pixel 40 and the fifth sub-pixel 50 are arranged obliquely with respect to the second direction, and the angle therebetween is an acute angle. In other words, the long axes of the fourth sub-pixel 40 and the fifth sub-pixel 50 are not parallel to or perpendicular to the second direction.

In the embodiment of the present disclosure, the angle between each of the long axes of the two sub-pixels (the fourth sub-pixel 40 and the fifth sub-pixel 50) and the second direction is an acute angle, which not only can reduce the length of the basic pixel unit 100 in the second direction, but also can reduce the length of the basic pixel unit 100 in the first direction, thereby reducing the area of the region occupied by the basic pixel unit 100, so that more basic pixel units 100 can be arranged in a limited space, the aperture ratio of the basic pixel unit 100 can be increased, the pixel current density can be reduced, and the service life of the display apparatus can be prolonged.

In some embodiments, the fourth sub-pixel 40 and the fifth sub-pixel 50 are mirror-symmetrical with respect to the long axis of the first sub-pixel 10.

As shown in FIGS. 1 and 2, the fourth sub-pixel 40 and the fifth sub-pixel 50 are arranged in the second direction relative to the first sub-pixel 10 and are arranged in mirror-symmetrical with respect to the long axis of the first sub-pixel 10 as the symmetry axis, so that color difference between a first display pixel unit and a second display pixel unit can be avoided, and the space occupied by the fourth sub-pixel 40 and the fifth sub-pixel 50 in the first direction can be reduced.

In some embodiments, the long axis of the first sub-pixel 10 is parallel to the second direction, and the long axis of the second sub-pixel 20 is parallel to the first direction.

As shown in FIG. 1 and FIG. 2, the long axis of the first sub-pixel 10 is parallel to the second direction, that is, the long axes of the first sub-pixel 10 and the third sub-pixel 30 are both parallel to the second direction, and sides of the first sub-pixel 10 and the third sub-pixel 30 opposite to each other are parallel to each other, so that the gap between the first sub-pixel 10 and the third sub-pixel 30 in the first direction can be reduced, the first sub-pixel 10 and the third sub-pixel 30 are more compact, the aperture ratio of the basic pixel unit 100 is increased, the pixel current density is reduced, and the service life of the display apparatus is prolonged.

In the embodiment of the present disclosure, the long axis of the second sub-pixel 20 is parallel to the first direction, that is, the long axis of the second sub-pixel 20 and the short axis of the first sub-pixel 10 are parallel to the first direction, which can reduce the lengths of the first sub-pixel 10 and the second sub-pixel 20 in the second direction, so that the basic pixel unit 100 is more compact in the second direction.

In some embodiments, sides of the second sub-pixel 20 and the first sub-pixel 10 opposite to each other are parallel to each other, so that the gap between the first sub-pixel 10 and the second sub-pixel 20 in the second direction can be reduced, the first sub-pixel 10 and the second sub-pixel 20 are more compact in the second direction, the aperture ratio of the basic pixel unit 100 is increased, the pixel current density is reduced, and the service life of the display apparatus is prolonged.

In some embodiments, the first sub-pixel 10, the second sub-pixel 20, and the third sub-pixel 30 have the same shape and the different areas; alternatively, the first sub-pixel 10, the second sub-pixel 20, and the third sub-pixel 30 may have the different shapes and the different areas.

A shape of the sub-pixel is a shape of an orthographic projection of the sub-pixel on a substrate, the substrate is a carrier for carrying the basic pixel unit 100. The shape of the sub-pixel may be any shape, but in the embodiment of the present disclosure, the shape of the sub-pixel is selected to be a shape having a length and a width different from each other.

In some embodiments, the first sub-pixel 10, the second sub-pixel 20, and the third sub-pixel 30 have the same shape but have different areas. For example, the first sub-pixel 10, the second sub-pixel 20, and the third sub-pixel 30 are all rectangular in shape, but the area of the first sub-pixel 10 is larger than that of the second sub-pixel 20, and the area of the second sub-pixel 20 is larger than that of the third sub-pixel 30.

In some embodiments, the first sub-pixel 10, the second sub-pixel 20 and the third sub-pixel 30 have different shapes but have different areas, i.e., are not uniform in shape and area. For example, the first sub-pixel 10 and the second sub-pixel 20 are rectangular in shape, and the third sub-pixel 30 is oval in shape; the area of the first sub-pixel 10 is larger than that of the second sub-pixel 20, and the area of the second sub-pixel 20 is larger than that of the third sub-pixel 30.

In the embodiment of the present disclosure, the basic pixel unit 100 may be more compact by changing the shapes and areas of the first sub-pixel 10, the second sub-pixel 20, and the third sub-pixel 30, more basic pixel units 100 may be disposed in the same space, the aperture ratio of the basic pixel unit 100 may be increased, and the pixel current density may be reduced, thereby improving the service life of the display apparatus.

In some embodiments, the area of the first sub-pixel 10 is larger than the area of the second sub-pixel 20, and the area of the second sub-pixel 20 is larger than the area of the third sub-pixel 30.

The area of the sub-pixel refers to an area of an orthographic projection of the sub-pixel on the substrate.

In the embodiment of the present disclosure, the first sub-pixel 10 is disposed in the middle region of the basic pixel unit 100, the second sub-pixel 20 and the third sub-pixel 30 are disposed around the first sub-pixel 10, and the area of the first sub-pixel 10 is larger than that of each of the second sub-pixel 20 and the third sub-pixel 30. The second sub-pixel 20 is disposed under the first sub-pixel 10, and the area of the second sub-pixel 20 is smaller than that of the first sub-pixel 10 and is larger than that of the third sub-pixel 30.

It should be noted that in the embodiment of the present disclosure, the shapes and sizes of the fourth sub-pixel 40 and the fifth sub-pixel 50 are the same as those of the third sub-pixel 30, and are not described herein again.

In the embodiment of the present disclosure, the area of each of the first sub-pixel 10 and the second sub-pixel 20 is larger than the area of the third sub-pixel 30, which is beneficial to rendering the sub-pixels, thereby improving the display effect of the display panel.

In some embodiments, the third sub-pixel 30, the fourth sub-pixel 40, and the fifth sub-pixel 50 have the same shape and the same area; alternatively, the third sub-pixel 30, the fourth sub-pixel 40 and the fifth sub-pixel 50 have different shapes and have the same area; alternatively, the third sub-pixel 30, the fourth sub-pixel 40, and the fifth sub-pixel 50 may have different shapes and different areas.

The shape of the third sub-pixel 30 is a shape of an orthographic projection of the third sub-pixel 30 on the substrate, and the shape of the third sub-pixel 30 may be a rectangle, a rounded rectangle (a rectangle with rounded corners), an ellipse, or other shapes with different lengths of the long axis and the short axis.

In some embodiments, the third sub-pixel 30, the fourth sub-pixel 40, and the fifth sub-pixel 50 in the basic pixel unit 100 may have the same shape and the same area. As shown in FIGS. 1 and 2, the third sub-pixel 30, the fourth sub-pixel 40, and the fifth sub-pixel 50 are all rectangular in shape, and the third sub-pixel 30, the fourth sub-pixel 40, and the fifth sub-pixel 50 have the same area, that is, the third sub-pixel 30, the fourth sub-pixel 40, and the fifth sub-pixel 50 are the same sub-pixel at different positions.

In some embodiments, the third sub-pixel 30, the fourth sub-pixel 40, and the fifth sub-pixel 50 in the basic pixel unit 100 may have different shapes but have the same area. For example, the shape of the third sub-pixel 30 may be a rounded rectangle, the shape of each of the fourth sub-pixel 40 and the fifth sub-pixel 50 may be an ellipse. However, the area of the third sub-pixel 30 is different from the area of each of the fourth sub-pixel 40 and the fifth sub-pixel 50. For another example, the shape of the third sub-pixel 30 may be a rounded rectangle, the shape of each of the fourth sub-pixel 40 and the fifth sub-pixel 50 may be a rectangle, and the areas of the third sub-pixel 30, the fourth sub-pixel 40 and the fifth sub-pixel 50 are different from each other.

In some embodiments, the third sub-pixel 30, the fourth sub-pixel 40, and the fifth sub-pixel 50 in the basic pixel unit 100 are all different in shape and area. For example, the shape of the third sub-pixel 30 may be a rounded rectangle, the shape of the fourth sub-pixel 40 may be an ellipse; the shape of the fifth sub-pixel 50 may be a rectangle; and the areas of the third sub-pixel 30, the fourth sub-pixel 40 and the fifth sub-pixel 50 are different from each other.

In the embodiment of the present disclosure, the shapes and areas of the third sub-pixel 30, the fourth sub-pixel 40, and the fifth sub-pixel 50 may be the same or different, and the compactness of the basic pixel unit 100 may be changed by adjusting the shapes and areas of the third sub-pixel 30, the fourth sub-pixel 40, and the fifth sub-pixel 50, so as to adjust the area of the basic pixel unit 100, and further change the PPI of the display panel.

Figure 3:
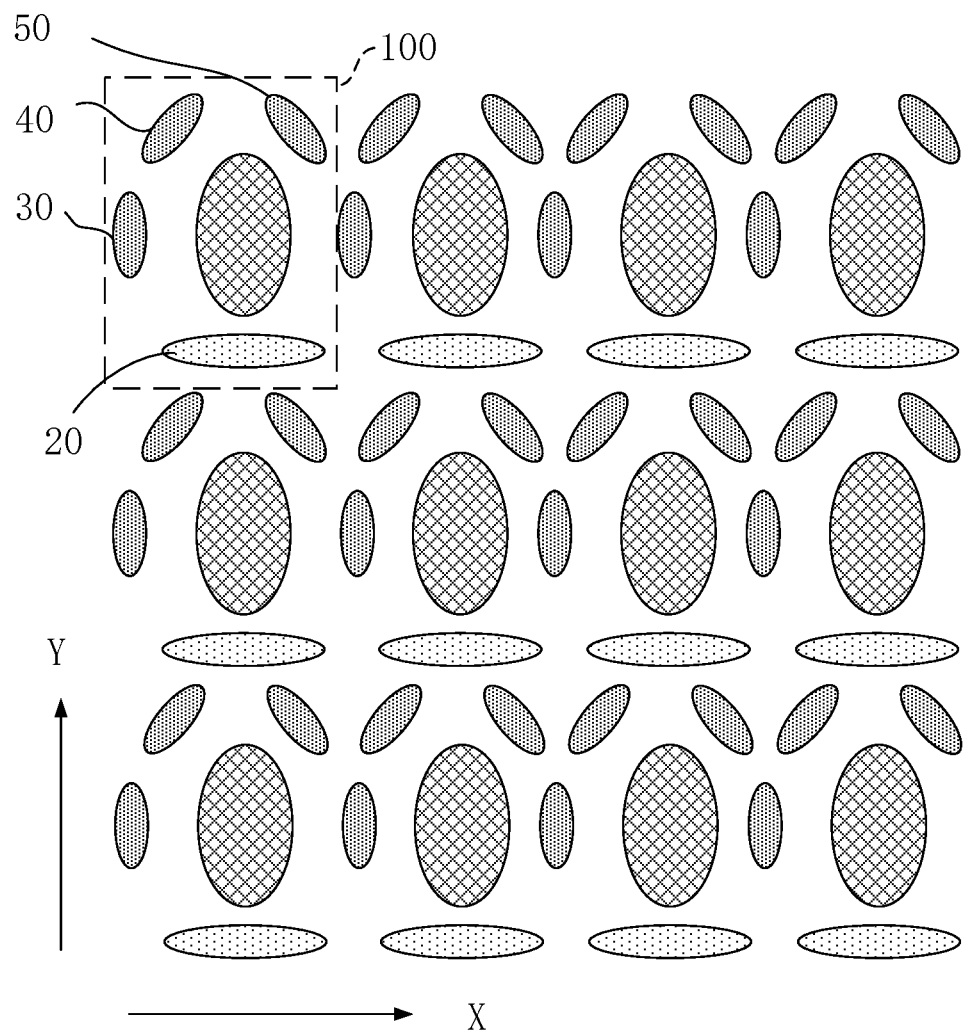
FIG. 3 is a schematic diagram of a pixel arrangement structure according to an embodiment of the present disclosure.

As shown in FIG. 3, each basic pixel unit includes a first sub-pixel 10, a second sub-pixel 20, a third sub-pixel 30, a fourth sub-pixel 40, and a fifth sub-pixel 50, and the first sub-pixel 10, the second sub-pixel 20, the third sub-pixel 30, the fourth sub-pixel 40, and the fifth sub-pixel 50 each are an ellipse in shape. The first sub-pixel 10, the second sub-pixel 20 and the third sub-pixel 30 are different in size, and the third sub-pixel 30, the fourth sub-pixel 40 and the fifth sub-pixel 50 are the same in size. It should be noted that a major axis of the ellipse is the long axis of the sub-pixel, and a minor axis of the ellipse is the short axis of the sub-pixel.

The long axis of the first sub-pixel 10 is parallel to the second direction, and the short axis of the first sub-pixel 10 is parallel to the first direction. The second sub-pixel 20 is disposed on the third side of the first sub-pixel 10, and the long axis of the second sub-pixel 20 is parallel to the first direction and the short axis of the second sub-pixel 20 is parallel to the second direction. The third sub-pixel 30 is disposed on the first side of the first sub-pixel 10, and the long axis of the third sub-pixel 30 is parallel to the second direction and the short axis of the third sub-pixel 30 is parallel to the first direction. The fourth sub-pixel 40 and the fifth sub-pixel 50 are disposed on the fourth side of the first sub-pixel 10, and the long axis of each of the fourth sub-pixel 40 and the fifth sub-pixel 50 is disposed obliquely with respect to the second direction, and the angle therebetween is an acute angle. The fourth sub-pixel 40 is located on the fourth side of the first sub-pixel 10 and is close to the first side, and the fifth sub-pixel 50 is located on the fourth side of the first sub-pixel 10 and is close to the second side.

Except the shapes and sizes of the first sub-pixel 10, the second sub-pixel 20, the third sub-pixel 30, the fourth sub-pixel 40, and the fifth sub-pixel 50, the pixel arrangement structure shown in FIG. 3 has substantially the same structure as the pixel arrangement structure shown in FIGS. 1 and 2, and thus the description thereof is omitted.

Figure 4:
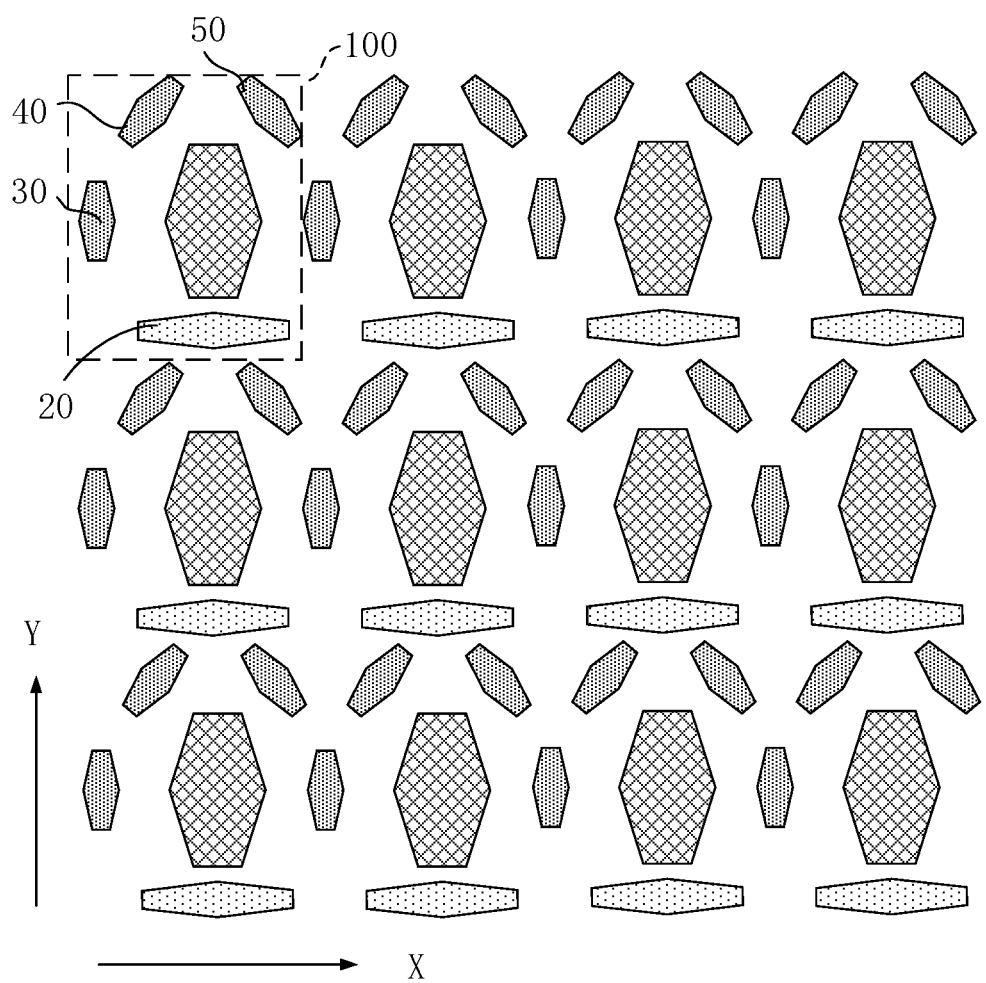
FIG. 4 is a schematic diagram of a pixel arrangement structure according to an embodiment of the present disclosure.

As shown in FIG. 4, each basic pixel unit includes a first sub-pixel 10, a second sub-pixel 20, a third sub-pixel 30, a fourth sub-pixel 40, and a fifth sub-pixel 50, and the first sub-pixel 10, the second sub-pixel 20, the third sub-pixel 30, the fourth sub-pixel 40, and the fifth sub-pixel 50 are all hexagonal in shape. The first sub-pixel 10, the second sub-pixel 20 and the third sub-pixel 30 are different in size, and the third sub-pixel 30, the fourth sub-pixel 40 and the fifth sub-pixel 50 are the same in size.

In some embodiments, lengths of six sides of the hexagon may be the same or different. For example, a length of each of a pair of symmetrical two sides (two symmetrical sides) of the six sides of the hexagon may be greater than that of each of the other two pairs of two symmetrical sides. It should be noted that a long axis of the hexagon is the long axis of the sub-pixel, and a short axis of the hexagon is the short axis of the sub-pixel.

The long axis of the first sub-pixel 10 is parallel to the second direction, and the short axis of the first sub-pixel 10 is parallel to the first direction. The second sub-pixel 20 is disposed on the third side of the first sub-pixel 10, and the long axis of the second sub-pixel 20 is parallel to the first direction and the short axis of the second sub-pixel 20 is parallel to the second direction. The third sub-pixel 30 is disposed on the first side of the first sub-pixel 10, and the long axis of the third sub-pixel 30 is parallel to the second direction and the short axis of the third sub-pixel 30 is parallel to the first direction. The fourth sub-pixel 40 and the fifth sub-pixel 50 are disposed on the fourth side of the first sub-pixel 10, and the long axis of each of the fourth sub-pixel 40 and the fifth sub-pixel 50 is disposed obliquely with respect to the second direction, and the angle therebetween is an acute angle. The fourth sub-pixel 40 is located on the fourth side of the first sub-pixel 10 and is close to the first side, and the fifth sub-pixel 50 is located on the fourth side of the first sub-pixel 10 and is close to the second side.

Except the shapes and sizes of the first sub-pixel 10, the second sub-pixel 20, the third sub-pixel 30, the fourth sub-pixel 40, and the fifth sub-pixel 50, the pixel arrangement structure shown in FIG. 4 has substantially the same structure as the pixel arrangement structure shown in FIGS. 1 and 2, and thus the description thereof is omitted.

Figure 5:
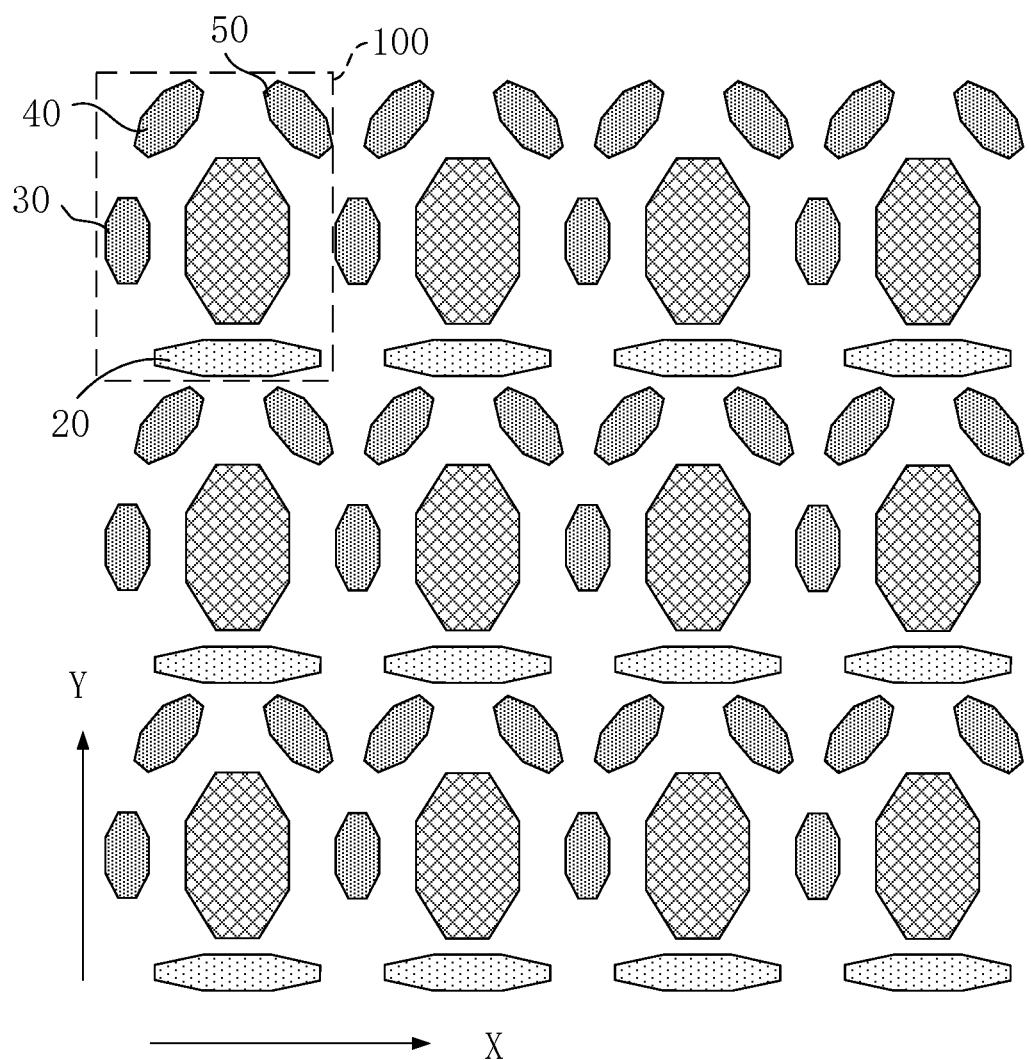
FIG. 5 is a schematic diagram of a pixel arrangement structure according to an embodiment of the present disclosure.

As shown in FIG. 5, each basic pixel unit includes a first sub-pixel 10, a second sub-pixel 20, a third sub-pixel 30, a fourth sub-pixel 40, and a fifth sub-pixel 50, and the first sub-pixel 10, the second sub-pixel 20, the third sub-pixel 30, the fourth sub-pixel 40, and the fifth sub-pixel 50 are all octagonal in shape. The first sub-pixel 10, the second sub-pixel 20 and the third sub-pixel 30 are different in size, and the third sub-pixel 30, the fourth sub-pixel 40 and the fifth sub-pixel 50 are the same in size.

In some embodiments, lengths of eight sides of the octagon may be the same or different. For example, a length of each of a pair of two symmetrical sides of the eight sides of the octagon may be greater than that of each of the other three pairs of two symmetrical sides. It should be noted that a long axis of the octagon is the long axis of the sub-pixel, and a short axis of the octagon is the short axis of the sub-pixel.

The long axis of the first sub-pixel 10 is parallel to the second direction, and the short axis of the first sub-pixel 10 is parallel to the first direction. The second sub-pixel 20 is disposed on the third side of the first sub-pixel 10, and the long axis of the second sub-pixel 20 is parallel to the first direction and the short axis of the second sub-pixel 20 is parallel to the second direction. The third sub-pixel 30 is disposed on the first side of the first sub-pixel 10, and the long axis of the third sub-pixel 30 is parallel to the second direction and the short axis of the third sub-pixel 30 is parallel to the first direction. The fourth sub-pixel 40 and the fifth sub-pixel 50 are disposed on the fourth side of the first sub-pixel 10, and the long axis of each of the fourth sub-pixel 40 and the fifth sub-pixel 50 is disposed obliquely with respect to the second direction, and the angle therebetween is an acute angle. The fourth sub-pixel 40 is located on the fourth side of the first sub-pixel 10 and is close to the first side, and the fifth sub-pixel 50 is located on the fourth side of the first sub-pixel 10 and is close to the second side.

Except the shapes and sizes of the first sub-pixel 10, the second sub-pixel 20, the third sub-pixel 30, the fourth sub-pixel 40, and the fifth sub-pixel 50, the pixel arrangement structure shown in, FIG. 5 has substantially the same structure as the pixel arrangement structure shown FIGS. 1 and 2, and thus the description thereof is omitted.

It should be noted that although FIGS. 3 to 5 show the sub-pixels having the shapes of an ellipse, a hexagon and an octagon, the embodiments of the present disclosure are not limited thereto, and the shapes of the sub-pixels may also be other different shapes, which is not listed in this application.

It should be further noted that in FIGS. 1 to 5, the shapes of the sub-pixels in each pixel arrangement are the same, i.e. the first sub-pixel 10, the second sub-pixel 20, the third sub-pixel 30, the fourth sub-pixel 40 and the fifth sub-pixel 50 are all rounded rectangles, ellipses, hexagons or octagons, but this does not mean that the shapes of the sub-pixels in each pixel arrangement must be the same. In some embodiments, the shapes of the sub-pixels in each pixel arrangement may be different. For example, the shapes of the first sub-pixel 10 and the second sub-pixel 20 are rounded rectangles, and the shapes of the third sub-pixel 30, the fourth sub-pixel 40, and the fifth sub-pixel 50 are ellipses. Alternatively, the shape of the first sub-pixel 10 is a rounded rectangle; the shape of the second sub-pixel 20 is a rounded rectangle; and the shapes of the third sub-pixel 30, the fourth sub-pixel 40, and the fifth sub-pixel 50 are hexagons.

In some embodiments, the first direction is perpendicular to the second direction, i.e. an angle between the first direction and the second direction is 90°. In practical applications, the angle between the first direction and the second direction can also be set as required. For example, the angle between the first direction and the second direction is in a range from 85° to 95°, i.e. the first direction and the second direction are perpendicular or substantially perpendicular to each other. The first direction and the second direction are substantially perpendicular to each other, which means that the first direction and the second direction are approximately perpendicular to each other.

It should be noted that in the embodiment of the present disclosure, the first direction and the second direction are only used to illustrate the arrangement of the basic pixel unit and the sub-pixels, and do not indicate the specific orientations of the first direction and the second direction. In practice, the first and second directions may be interchanged.

In some embodiments, the first sub-pixel 10 is a blue pixel, the second sub-pixel 20 is a red pixel, and the third sub-pixel 30, the fourth sub-pixel 40, and the fifth sub-pixel 50 are green pixels. Alternatively, the first sub-pixel 10 is a red pixel, the second sub-pixel 20 is a blue pixel, and the third sub-pixel 30, the fourth sub-pixel 40, and the fifth sub-pixel 50 are green pixels.

In the embodiment of the present disclosure, the number ratio of the blue (B), red (R) and green (G) pixels is 1:1:3 or the number ratio of the red (R), blue (B) and green (G) pixels is 1:1:3 throughout the display panel.

According to the pixel arrangement structure provided by the embodiment of the present disclosure, the number of the green sub-pixels in each display pixel unit is larger, the aperture ratio of the green pixels is high, and thus, the service life of the display panel can be prolonged.

In some embodiments, the first sub-pixel 10, the second sub-pixel 20, the third sub-pixel 30 and the fourth sub-pixel 40 in a first basic pixel unit 100A form one display pixel unit; and the first sub-pixel 10, the second sub-pixel 20 and the fifth sub-pixel in the first basic pixel unit 100A, and the third sub-pixel 30 in a second basic pixel unit 100B form one display pixel unit, that is, the first sub-pixel 10, the second sub-pixel 20 and the third sub-pixel 30 are shared between display pixel units through the sub-pixel rendering technology. That is, the first sub-pixel 10, the second sub-pixel 20 and the third sub-pixel 30 are shared by the two display pixel units through the sub-pixel rendering technology. In the pixel arrangement structure provided by the embodiment of the present disclosure, through the sub-pixel rendering technology, the display effect of the display panel is finer and smoother, and the edges of the display panel have no saw tooth feeling.

The following description will be given by taking first and second basic pixel units 100A and 100B arranged adjacent to each other in the first direction in FIG. 2 as an example.

The first sub-pixel 10, the second sub-pixel 20, the third sub-pixel 30, and the fourth sub-pixel 10 in the first basic pixel unit 100A form a first display pixel unit 201 (a dotted line frame in the figure), and the first sub-pixel 10, the second sub-pixel 20, and the fifth sub-pixel 50 in the first basic pixel unit 100A and the third sub-pixel 30 in the second basic pixel unit 100B adjacent to the first basic pixel unit 100A form a second display pixel unit 202 (a dot line frame in the figure). The first sub-pixel 10 and the second sub-pixel 20 in the first basic pixel unit 100A are shared by the first display pixel unit 201 and the second display pixel unit 202, the fourth sub-pixel 40 in the first basic pixel unit 100A is independently applied to the first display pixel unit 201, and the fifth sub-pixel 50 in the first basic pixel unit 100A is independently applied to the second display pixel unit 202. The third sub-pixel 30 in the second basic pixel unit 100B is shared by two display pixel units, i.e. the third sub-pixel 30 in the second basic pixel unit 100B is applied to both the second display pixel unit 202 in the first basic pixel unit 100A and the first display pixel unit 201 in the second basic pixel unit 100B. The first sub-pixel 10, the second sub-pixel 20, the third sub-pixel 30, and the fourth sub-pixel 40 in the second basic pixel unit 100B form a third display pixel unit 203.

In the embodiment of the present disclosure, through the sub-pixel rendering technology, the first sub-pixel 10 and the second sub-pixel 20 may be shared by two display pixel units, and the third sub-pixel 30 may be shared by another two display pixel units, so that the number of display pixel units is twice as many as the number of basic pixel units, thereby obtaining a higher PPI for the display panel.

In some embodiments, light emitting layers corresponding to the fifth sub-pixel in the basic pixel unit, the third sub-pixel and the fourth sub-pixel in the other basic pixel unit adjacent to the second side of the basic pixel unit have a one-piece structure.

As shown in FIG. 2, the first basic pixel unit 100A and the second basic pixel unit 100B are two adjacent basic pixel units, and the second basic pixel unit 100B is located on the second side of the first basic pixel unit 100A. The light emitting layers corresponding to the fifth sub-pixel 50 in the first basic pixel unit 100A and the third sub-pixel 30 and the fourth sub-pixel 40 in the second basic pixel unit 100B have a one-piece structure.

Specifically, when the light emitting layers of the pixel arrangement structure are prepared, a same mask is used for the fifth sub-pixel 50 in the first basic pixel unit 100A and the third sub-pixel 30 and the fourth sub-pixel 40 in the second basic pixel unit 100B, so that the light emitting layers corresponding to the fifth sub-pixel 50 in the first basic pixel unit 100A and the third sub-pixel 30 and the fourth sub-pixel 40 in the second basic pixel unit 100B have a one-piece structure, which can simplify the manufacturing process and reduce the manufacturing cost.

The embodiment of the present disclosure further provides a display panel, which includes the pixel arrangement structure provided by the embodiment of the present disclosure.

In some embodiments, the display panel includes an active matrix organic light emitting diode display panel, i.e., the sub-pixels may be active light emitting devices such as organic light emitting diodes.

In the embodiment of the present disclosure, in the pixel arrangement structure, the first sub-pixel and the second sub-pixel are shared by two display pixel units, and the third sub-pixel is shared by two display pixel units, so that the display effect of the display panel is finer and smoother through the sub-pixel rendering technology, and the edges of the display panel have no saw tooth feeling; the space of the display panel can be effectively utilized, so that the display panel obtains a higher PPI. Meanwhile, the aperture ratio of a pixel unit is increased, a current density of a pixel is reduced, and a service life of the display apparatus is prolonged.

The embodiment of the present disclosure also provides a display apparatus, which includes the display panel provided by the embodiment of the present disclosure. The display apparatus may be applied to the fields of mobile phones, computers, vehicle-mounted terminals, wearable terminals, VR terminals and the like.

In the display apparatus provided by the embodiment of the present disclosure, in the pixel arrangement structure, the first sub-pixel and the second sub-pixel are shared by two display pixel units, and the third sub-pixel is shared by two display pixel units, so that the display effect of the display apparatus is finer and smoother through the sub-pixel rendering technology, and the edges have no saw tooth feeling; the aperture ratio of a pixel unit is increased, a current density of a pixel is reduced, and a service life of the display apparatus is prolonged.

Figure 6:
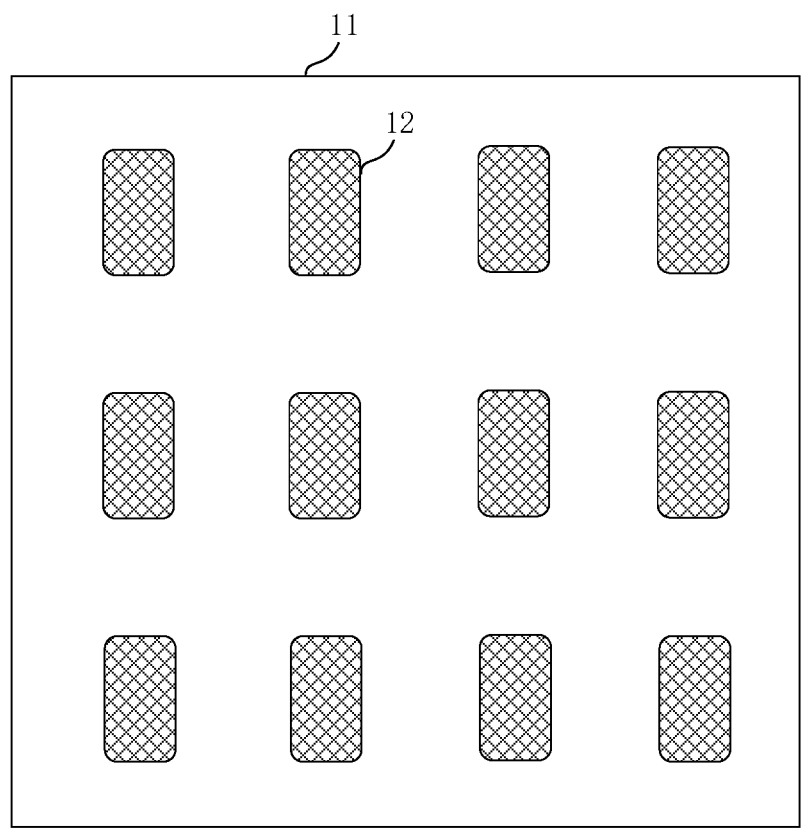
FIG. 6 is a schematic diagram of a structure of a first mask according to an embodiment of the present disclosure.
Figure 7:
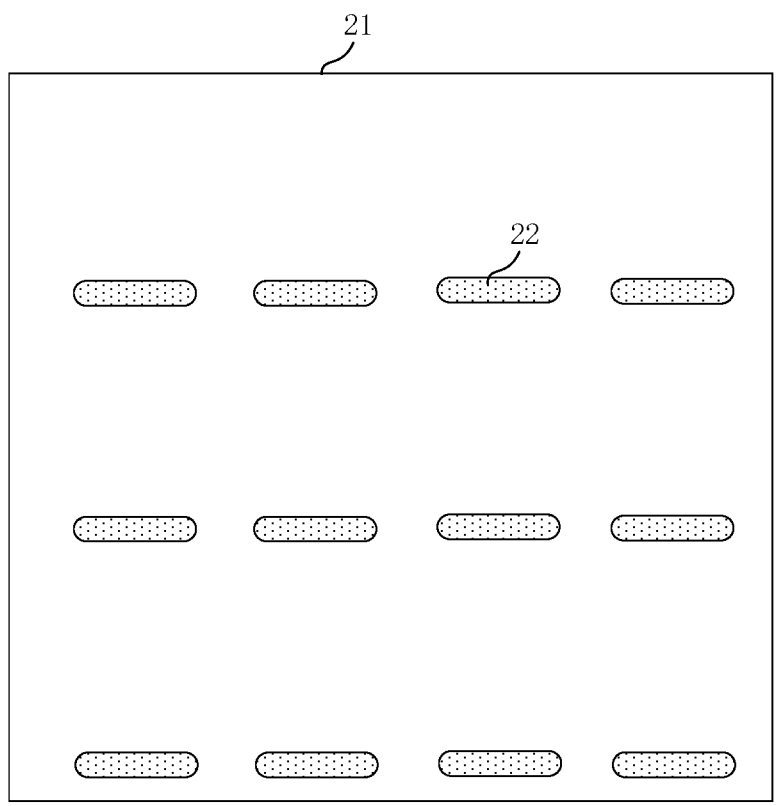
FIG. 7 is a schematic diagram of a structure of a second mask according to an embodiment of the present disclosure.
Figure 8:
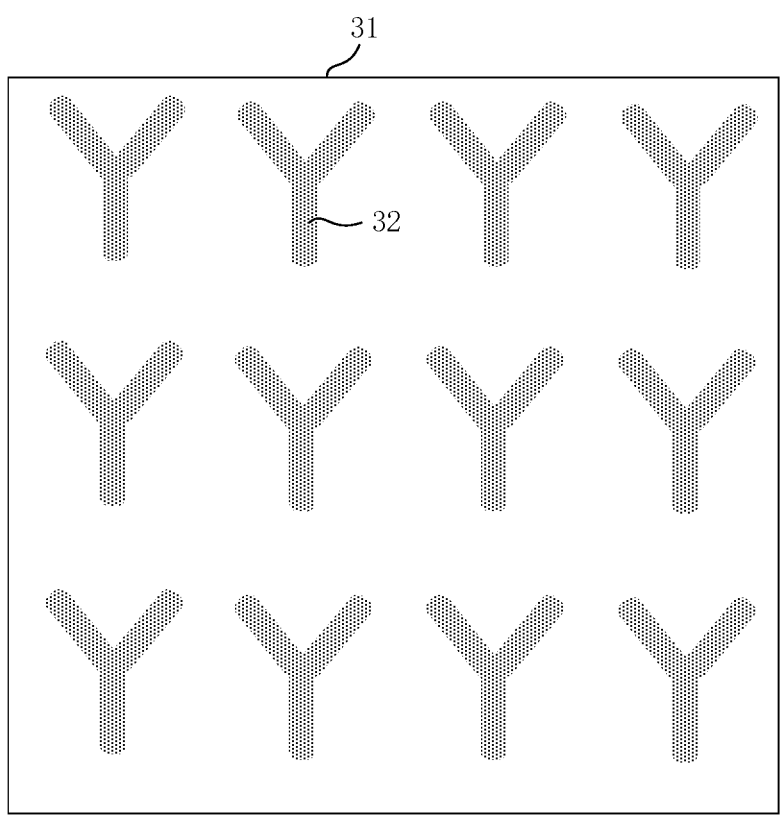
FIG. 8 is a schematic diagram of a structure of a third mask according to an embodiment of the present disclosure.

The embodiment of the present disclosure further provides a mask for manufacturing the pixel arrangement structure provided by the embodiment of the present disclosure. Referring to FIGS. 6 to 8, the mask includes: a first mask 11, a second mask 21 and a third mask 31, wherein the first mask 11 is provided with a plurality of first openings 12 therein at intervals in the first direction and/or the second direction, and the plurality of first openings 12 are used for forming first sub-pixels; the second mask 21 is provided with a plurality of second openings 22 therein at intervals in the first direction and/or the second direction, and the plurality of second openings 22 are used for forming second sub-pixels; the third mask 31 is provided with a plurality of third openings 32 therein at intervals in the first direction and/or the second direction, and the plurality of third openings 32 are used for forming third sub-pixels 30, fourth sub-pixels 40, and fifth sub-pixels 50.

In the embodiment of the present disclosure, the first sub-pixels and the second sub-pixels are formed by using the first mask 11 and the second mask 21 in an evaporation manner, respectively, and the third sub-pixel 30, the fourth sub-pixel 40 and the fifth sub-pixel 50 are formed by using the third mask 31 in an evaporation manner, so that the pixel arrangement structure provided in the embodiment of the present disclosure is obtained.

In some embodiments, the first mask 11, the second mask 21, and the third mask 31 are precision metal masks. When manufacturing the display panel, the corresponding sub-pixels are formed by evaporating organic light emitting materials of different colors. The smaller the opening of the third mask 31 is, the smaller the area of each third sub-pixel is, so that the resolution of the display panel can be improved. The higher the aperture ratio of the third mask 31 is, the lower the current density of the corresponding sub-pixel is, thereby improving the service life of the display panel. In the embodiment of the present disclosure, the third sub-pixels are provided so that the opening of the third mask 31 can be reduced, and the aperture ratio can be improved, thereby improving the resolution and the service life of the display panel.

In some embodiments, when the basic pixel units arranged in the first direction are formed, three adjacent sub-pixels of two adjacent basic pixel units (the third sub-pixel 30, the fourth sub-pixel 40 of one basic pixel unit and the fifth sub-pixel 50 of the other one basic pixel unit) are formed by the same third opening.

As shown in FIG. 8, the fifth sub-pixel 50 in the first basic pixel unit 100A and the third sub-pixel 30 and the fourth sub-pixel 40 in the second basic pixel unit 100B are three adjacent sub-pixels, and thus each third opening 32 in the third mask has a "Y" shape. In the evaporation process, the third sub-pixel 30, the fourth sub-pixel 40 and the fifth sub-pixel 50 can be formed by using the same third opening 32, so that the process difficulty and the manufacturing cost are reduced; furthermore, the three sub-pixels can be distinguished from each other by a pixel defining layer of the display panel.

In the embodiment of the present disclosure, the adjacent sub-pixels in two adjacent basic pixel units 100 are formed by using the same opening, so that the manufacturing process can be simplified, and the manufacturing cost can be reduced.

It should be noted that in this document, the terms "comprises," "including" or any other variation thereof, are intended to cover a non-exclusive inclusion, such that a process, method, article, or apparatus that includes a list of elements does not include only those elements but may include other elements not expressly listed or inherent to such process, method, article, or apparatus. Without further limitation, an element identified by the phrase "including" does not exclude the presence of other identical elements in the process, method, article, or apparatus that includes the element.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A pixel arrangement structure, comprising: a plurality of basic pixel units arranged in a first direction and/or a second direction, wherein
    each of the plurality of basic pixel units comprises a first sub-pixel, a second sub-pixel, a third sub-pixel, a fourth sub-pixel and a fifth sub-pixel, the first sub-pixel, the second sub-pixel and the third sub-pixel are sub-pixels of different colors, and the third sub-pixel, the fourth sub-pixel and the fifth sub-pixel are sub-pixels of a same color;
    the first sub-pixel comprises a first side and a second side opposite to each other in the first direction, and a third side and a fourth side opposite to each other in the second direction; and
    the second sub-pixel is on the third side of the first sub-pixel and is separated from the third side of the first sub-pixel, the third sub-pixel is on the first side of the first sub-pixel and is separated from the first side of the first sub-pixel, the fourth sub-pixel and the fifth sub-pixel are both on the fourth side of the first sub-pixel and are separated from the fourth side of the first sub-pixel, and the fourth sub-pixel and the fifth sub-pixel are separated from each other in the first direction.

2. The pixel arrangement structure according to claim 1, wherein
    a long axis of each of the fourth sub-pixel and the fifth sub-pixel is arranged obliquely with respect to the second direction, and
    an angle between the long axis and the second direction is an acute angle.

3. The pixel arrangement structure according to claim 2, wherein the fourth sub-pixel and the fifth sub-pixel are mirror-symmetrical with respect to a straight line, on which a long axis of the first sub-pixel is located, as a symmetry axis.

4. The pixel arrangement structure according to claim 1, wherein a long axis of the first sub-pixel is parallel to the second direction and a long axis of the second sub-pixel is parallel to the first direction.

5. The pixel arrangement structure according to claim 1, wherein the first sub-pixel, the second sub-pixel and the third sub-pixel have a same shape and have different areas; or
the first sub-pixel, the second sub-pixel and the third sub-pixel have different shapes and have different areas.

6. The pixel arrangement structure according to claim 5, wherein an area of the first sub-pixel is larger than an area of the second sub-pixel, and the area of the second sub-pixel is larger than an area of the third sub-pixel.

7. The pixel arrangement structure according to claim 1, wherein the third sub-pixel, the fourth sub-pixel and the fifth sub-pixel have a same shape and have a same area.

8. The pixel arrangement structure according to claim 1, wherein the first direction is perpendicular to the second direction.

9. The pixel arrangement structure according to claim 1, wherein the first sub-pixel is a blue sub-pixel, the second sub-pixel is a red sub-pixel, and the third sub-pixel, the fourth sub-pixel and the fifth sub-pixel each are a green sub-pixel; or
the first sub-pixel is a red sub-pixel, the second sub-pixel is a blue sub-pixel, and the third sub-pixel, the fourth sub-pixel and the fifth sub-pixel each are a green sub-pixel.

10. The pixel arrangement structure according to claim 1, wherein light emitting layers of the fifth sub-pixel in one basic pixel unit, the third sub-pixel and the fourth sub-pixel in another basic pixel unit adjacent to a second side of the one basic pixel unit have a one-piece structure.

11. A display panel, comprising: pixel arrangement structure, which comprises a plurality of basic pixel units arranged in a first direction and/or a second direction, wherein
each of the plurality of basic pixel units comprises a first sub-pixel, a second sub-pixel, a third sub-pixel, a fourth sub-pixel and a fifth sub-pixel, the first sub-pixel, the second sub-pixel and the third sub-pixel are sub-pixels of different colors, and the third sub-pixel the fourth sub-pixel and the fifth sub-pixel are sub-pixels of a same color,
the first sub-pixel comprises a first side and a second side opposite to each other in the first direction, and a third side and a fourth side opposite to each other in the second direction; and
the second sub-pixel is on the third side of the first sub-pixel and is separated from the third side of the first sub-pixel, the third sub-pixel is on the first side of the first sub-pixel and is separated from the first side of the first sub-pixel, the fourth sub-pixel and the fifth sub-pixel are both on the fourth side of the first sub-pixel and are e separated from the fourth side of the first sub-pixel, and the fourth sub-pixel and the fifth sub-pixel are separated from each other in the first direction.

12. The display panel according to claim 11, wherein the display panel comprises an active matrix organic light emitting diode display panel.

13. A display apparatus, comprising the display panel according to claim 11.

14. A mask group for manufacturing a pixel arrangement structure, which comprises a plurality of basic pixel units arranged in a first direction and/or a second direction wherein
each of the plurality of basic pixel units comprises a first sub-pixel, a second sub-pixel, a third sub-pixel, a fourth sub-pixel and a fifth sub-pixel, the first sub-pixel, the second sub-pixel and the third sub-pixel are sub-pixels of different colors, and the third sub-pixel, the fourth sub-pixel and the fifth sub-pixel are sub-pixels of a same color;
the first sub-pixel comprises a first side and a second side opposite to each other in the first direction, and a third side and a fourth side opposite to each other in the second direction; and
the second sub-pixel is on the third side of the first sub-pixel and is separated from the third side of the first sub-pixel, the third sub-pixel is on the first side of the first sub-pixel and is separated rom the first side of the first sub-pixel, the fourth sub-pixel and the fifth sub-pixel are both on the fourth side of the first sub-pixel and are separated from the fourth side of the first sub-pixel, and the fourth sub-pixel and the fifth sub-pixel are separated from each other in the first direction,
wherein the mask group comprises: a first mask, a second mask and a third mask, wherein the first mask is provided with a plurality of first openings therein at intervals in the first direction and/or the second direction, and the plurality of first openings are used for forming first sub-pixels; the second mask is provided with a plurality of second openings therein at intervals in the first direction and/or the second direction, and the plurality of second openings are used for forming second sub-pixels; the third mask is provided with a plurality of third openings therein at intervals in the first direction and/or the second direction, and the plurality of third openings are used for forming third sub-pixels, fourth sub-pixels, and fifth sub-pixels.

15. The mask group according to claim 14, wherein the fifth sub-pixel of one basic pixel unit, and the third sub-pixel and the fourth sub-pixel of another basic pixel unit adjacent to the second side of the one basic pixel unit are formed by a same third opening when multiple basic pixel units arranged in the first direction are formed.

16. The pixel arrangement structure according to claim 2, wherein the first direction is perpendicular to the second direction.

17. The pixel arrangement structure according to claim 2, wherein the first sub-pixel is a blue sub-pixel, the second sub-pixel is a red sub-pixel, and the third sub-pixel, the fourth sub-pixel and the fifth sub-pixel each are a green sub-pixel; or
the first sub-pixel is a red sub-pixel, the second sub-pixel is a blue sub-pixel, and the third sub-pixel, the fourth sub-pixel and the fifth sub-pixel each are a green sub-pixel.

18. The pixel arrangement structure according to claim 2, wherein light emitting layers of the fifth sub-pixel in one basic pixel unit, the third sub-pixel and the fourth sub-pixel in another basic pixel unit adjacent to a second side of the one basic pixel unit have a one-piece structure.

19. The pixel arrangement structure according to claim 3, wherein the first direction is perpendicular to the second direction.

20. The pixel arrangement structure according to claim 3, wherein the first sub-pixel is a blue sub-pixel, the second sub-pixel is a red sub-pixel, and the third sub-pixel, the fourth sub-pixel and the fifth sub-pixel each are a green sub-pixel; or the first sub-pixel is a red sub-pixel, the second sub-pixel is a blue sub-pixel, and the third sub-pixel, the fourth sub-pixel and the fifth sub-pixel each are a green sub-pixel.

\* \* \* \* \*